US010251313B2

(12) United States Patent
Meyer

(10) Patent No.: US 10,251,313 B2
(45) Date of Patent: Apr. 2, 2019

(54) AIR-GRATE FLOOR PANEL SUB-PLENUM RETROFIT ADD ON MULTI-DIRECTIONAL PLUME

(71) Applicant: Gary Meyer, Berthoud, CO (US)

(72) Inventor: Gary Meyer, Berthoud, CO (US)

(73) Assignee: RAYMOND & LAE ENGINEERING, INC., Fort Collins, CO (US)

(*) Notice: Subject to any disclaimer, the term of this patent is extended or adjusted under 35 U.S.C. 154(b) by 22 days.

(21) Appl. No.: 15/465,481

(22) Filed: Mar. 21, 2017

(65) Prior Publication Data

US 2017/0273225 A1 Sep. 21, 2017

Related U.S. Application Data

(60) Provisional application No. 62/310,923, filed on Mar. 21, 2016.

(51) Int. Cl.
H05K 7/20 (2006.01)
E04F 15/024 (2006.01)
F24F 7/10 (2006.01)
F24F 13/062 (2006.01)

(52) U.S. Cl.
CPC ... H05K 7/20745 (2013.01); E04F 15/02405 (2013.01); F24F 7/10 (2013.01); F24F 13/062 (2013.01); H05K 7/20181 (2013.01); F24F 2221/40 (2013.01)

(58) Field of Classification Search
CPC .............................. H05K 7/20; H05K 7/20745

USPC .................................................. 454/187, 184
See application file for complete search history.

(56) References Cited

U.S. PATENT DOCUMENTS

| 3,303,771 | A | * | 2/1967 | Nesher | E04B 9/0478 454/187 |
| 4,729,292 | A | * | 3/1988 | Marton | F24F 13/075 454/284 |
| 4,745,715 | A | * | 5/1988 | Hardwicke | E04F 15/02405 52/126.6 |
| 4,825,603 | A | * | 5/1989 | Hardwicke | E04F 15/02405 52/126.6 |
| 4,991,496 | A | * | 2/1991 | Kuno | F24F 13/06 454/299 |
| 5,218,998 | A | * | 6/1993 | Bakken | F24F 13/12 137/625.28 |

(Continued)

Primary Examiner — Steven B McAllister
Assistant Examiner — Samantha Probst
(74) Attorney, Agent, or Firm — William W. Cochran; Cochran Freund & Young LLC

(57) ABSTRACT

Disclosed is the redirection of air flow in a sub-plenum using a multi-directional plume that is attached to the bottom surface of an air-grate floor panel. The air-grate floor panel 102 has openings which allow redirected air to flow in an upward direction to cool computer equipment, including servers. The multi-directional plume has a series of vanes that are disposed in various different directions to deflect a flow of air conditioning air through a sub-plenum in a vertical direction to flow through openings in the air-grate floor panel. Since the multi-directional plume is capable of redirecting air from various different directions in the sub-plenum, the air-grate floor panels do not have to be repositioned to capture air flow from any particular direction.

9 Claims, 5 Drawing Sheets

(56) References Cited

U.S. PATENT DOCUMENTS

| | | | | |
|---|---|---|---|---|
| 5,402,617 A * | 4/1995 | Daw | E04F 15/02405 | 52/220.5 |
| 6,019,677 A * | 2/2000 | Demster | F24F 7/10 | 454/289 |
| 6,101,768 A * | 8/2000 | Springstead | F24F 13/068 | 454/334 |
| 6,256,952 B1 * | 7/2001 | Fahy, Jr. | E04B 9/02 | 52/126.6 |
| 6,402,612 B2 * | 6/2002 | Akhtar | F24F 7/007 | 181/224 |
| 6,604,993 B1 * | 8/2003 | Boniface | E04F 15/02458 | 165/168 |
| 6,747,872 B1 * | 6/2004 | Patel | G06F 1/20 | 361/695 |
| D567,398 S * | 4/2008 | Meyer | D25/156 | |
| 7,643,291 B2 * | 1/2010 | Mallia | G06F 1/20 | 361/695 |
| 8,427,830 B2 * | 4/2013 | Absalom | H05K 7/20745 | 361/679.51 |
| 8,776,452 B1 * | 7/2014 | DeJonge | E04F 15/06 | 52/126.1 |
| 8,955,278 B1 * | 2/2015 | Mills | E04B 5/48 | 52/302.3 |
| 2004/0198214 A1 * | 10/2004 | Karidis | F24F 7/10 | 454/186 |
| 2006/0003684 A1 * | 1/2006 | Hwang | F24F 3/161 | 454/186 |
| 2007/0173189 A1 * | 7/2007 | Lewis | H05K 7/20009 | 454/184 |
| 2007/0213000 A1 * | 9/2007 | Day | H05K 7/20754 | 454/184 |
| 2008/0108296 A1 * | 5/2008 | Rimmer | F24F 7/06 | 454/256 |
| 2008/0160903 A1 * | 7/2008 | Fontana | F24F 13/085 | 454/289 |
| 2008/0274685 A1 * | 11/2008 | DeJonge | F24F 13/082 | 3/82 |
| 2009/0293518 A1 * | 12/2009 | Bettella | F04D 25/12 | 62/186 |
| 2010/0081371 A1 * | 4/2010 | Dinicolas | F24F 1/58 | 454/275 |
| 2010/0297927 A1 * | 11/2010 | Nagamatsu | H05K 7/20745 | 454/256 |
| 2011/0097989 A1 * | 4/2011 | McQueeny, Jr. | A47B 13/00 | 454/289 |
| 2011/0244779 A1 * | 10/2011 | Ohba | F24F 11/0001 | 454/184 |
| 2011/0275304 A1 * | 11/2011 | Badenhorst | F24F 7/10 | 454/290 |
| 2012/0009862 A1 * | 1/2012 | Meyer | H05K 7/20745 | 454/184 |
| 2012/0060429 A1 * | 3/2012 | Reynolds | E04F 15/02405 | 52/19 |
| 2012/0064817 A1 * | 3/2012 | Choi | F24F 5/0035 | 454/251 |
| 2012/0164929 A1 * | 6/2012 | Meyer | H05K 7/20745 | 454/184 |
| 2013/0104464 A1 * | 5/2013 | Meyer | E04F 15/02405 | 52/126.6 |
| 2013/0186026 A1 * | 7/2013 | Curtin | F24F 13/068 | 52/302.1 |
| 2014/0123576 A1 * | 5/2014 | Meyer | E04F 15/02452 | 52/126.6 |
| 2014/0138047 A1 * | 5/2014 | Phelps | H05K 7/20745 | 165/57 |
| 2014/0220874 A1 * | 8/2014 | Meyer | F24H 3/002 | 454/159 |
| 2014/0335776 A1 * | 11/2014 | Cochran | H05K 7/20145 | 454/284 |
| 2015/0099456 A1 * | 4/2015 | McQueeny, Jr. | F24F 13/12 | 454/322 |
| 2015/0128515 A1 * | 5/2015 | Meyer | E04F 15/02458 | 52/302.3 |
| 2015/0276259 A1 * | 10/2015 | Taylor | F24F 13/082 | 454/275 |

* cited by examiner

AIR-GRATE FLOOR PANEL SUB-PLENUM RETROFIT ADD ON MULTI-DIRECTIONAL PLUME

BACKGROUND

The term "sub-plenum" means that portion of the computer room below the air-grate floor panels when installed on a pedestal support system. The term "upper plenum" means that portion of the computer room above the air-grate floor panels, including the data processing server equipment and in-row air conditioners, or air handling units. Thus, the term "computer room" means the overall air handling environment including the upper and sub plenums from the subfloor to the ceiling. Finally, "CRAC units" means those computer room air conditioning units typically located at the perimeter of the data center floor surrounding the (server) racks, or in-rows, to circulate air in the data center space to create a cooling loop.

Raised floor systems are used in data centers to create a sub-plenum space between the subfloor, of a building, and the normal operating environment of the computer room. The sub-plenum space is used for circulating cooling air to the computer servers. Perforations in the top plates, of air-grate floor panels, are configured to enhance the circulation of cooling air through the raised floor. Air-grate floor panels use an open-box load bearing frame. The open-box frame is designed with longitudinally spaced apart vertical girder plates, and transverse vertical reinforcing rib plates, in a crisscrossed assembly, for supporting the load.

Manufacturers of raised floor panels have engaged in the redesign and development of the open box sub-frame to include girder plates which are configured with a lower vaned face, which acts to redirect a tangential cooling airflow, originating in the sub-plenum, upwardly, through the open air-grate perforations in the top plate with an object of enhancing cooling efficiency to the server cabinets. One such design, which has gained side acceptance in the industry, is the open box sub-frame disclosed in U.S. Pat. No. D567,398, entitled "Floor Panel Superstructure," issued Apr. 22, 2008, to Meyer, which is specifically incorporated herein by reference for all that it discloses and teaches. There, it is ordinarily observed that the supporting girder plates, of the open box subframe, include lower inclined airfoils that are capable of capture and redirection of a tangential flow of cooling air. It can be appreciated that a fluid dynamic, inherent in use of this design, would result in an increase in the volume and directional velocity of the cooling air flowing from the sub-plenum and into the upper plenum, of a computer room, through the slotted perforations in the air-grate floor panel top plate. This increase in velocity enhances cooling efficiency, and further promotes the creation of an air separation barrier within the computer room.

Another such example is the air grate floor panel sub-plenum retrofit airfoil disclosed in U.S. Pat. No. 9,217,252, to Meyer. There, it is ordinarily observed a retrofit airfoil for attachment to at least one of the girder members of an open-box load bearing frame supporting an air-grate raised access floor panel. The open box frame includes a plurality of longitudinally spaced apart vertical girder-plate members and a plurality of longitudinally spaced apart transverse vertical reinforcing rib-plate members. The airfoil includes a sheet. The sheet has an upper edge, a lower edge, and a horizontal bend formation positioned along a longitudinal axis established therebetween. The bend formation defines an upper vertical face, and a lower inclined face.

SUMMARY OF THE INVENTION

An embodiment of the invention may therefore comprise, in a raised floor system, a method for redirection of an omni-directional tangential sub-plenum airflow, comprising: providing an air-grate raised floor panel having an upper surface, a lower surface and at least one open air flow duct portion extending therethrough; providing an anterior air-flow plume attachment, the attachment being a sheet configured with a plurality of downwardly projection tangential air-flow capturing vane members, the vane members defining corresponding open air-flow channel portions; attaching a top wall of the top plate of the anterior air-flow plume adjacent to the lower surface of the air-grate raised floor panel; installing the air-grate floor panel on a raised floor pedestal support system; supplying a sub-plenum of the raised floor pedestal support system with the tangential air-flow; and using the anterior air-flow plume attachment to redirect the tangential air-flow through the duct portion without repositioning the installed air-grate floor panel.

An embodiment of the invention may further comprise an omni-directional airflow plenum for attachment to the anterior of a raised floor air-grate panel comprising: a sheet having a pattern established to form a plurality of predetermined cut out formations, the formations defining a plurality of air redirecting vanes and open air flow channels.

An embodiment of the invention may further comprise a method of redirecting air in a sub-plenum of a raised floor system having air-grate floor panels comprising: providing a multi-directional plume that has a plurality of vanes that are directed in at least two different directions at an angle from a surface of the multi-directional plume, and openings in the surface of the multi-directional plume adjacent the vanes; attaching the multi-directional plume to a lower surface of the air-grate floor panels so that the plurality of vanes extend below the air-grate floor panels and the multi-directional plume in the sub-plenum of the raised floor system and are disposed in at least two different directions to redirect air that is flowing in the sub-plenum towards openings in the air-grate floor panels when the air-grate floor panels are installed in the raised floor system.

An embodiment of the invention may further comprise a system for redirecting sub-plenum air of a sub-plenum in a raised floor system comprising: an air-grate floor panel having an open box load bearing frame and a top plate having openings that allow air to pass through the air-grate floor panel; a multi-directional plume having a plurality of vanes that are directed in at least two different directions that form an angle with a surface of the multi-directional plume so that the plurality of vanes extend outwardly from the surface; connectors disposed on the multi-directional plume that connect the multi-directional plume to the air-grate floor panel such that the plurality of vanes extend outwardly into the sub-plenum when the air-grate floor panel and the multi-directional plume are disposed in the raised floor system and redirect air flowing in the sub-plenum through the openings in the top plate of the air-grate floor panel.

DETAILED DESCRIPTION OF THE EMBODIMENTS

Figure 1:
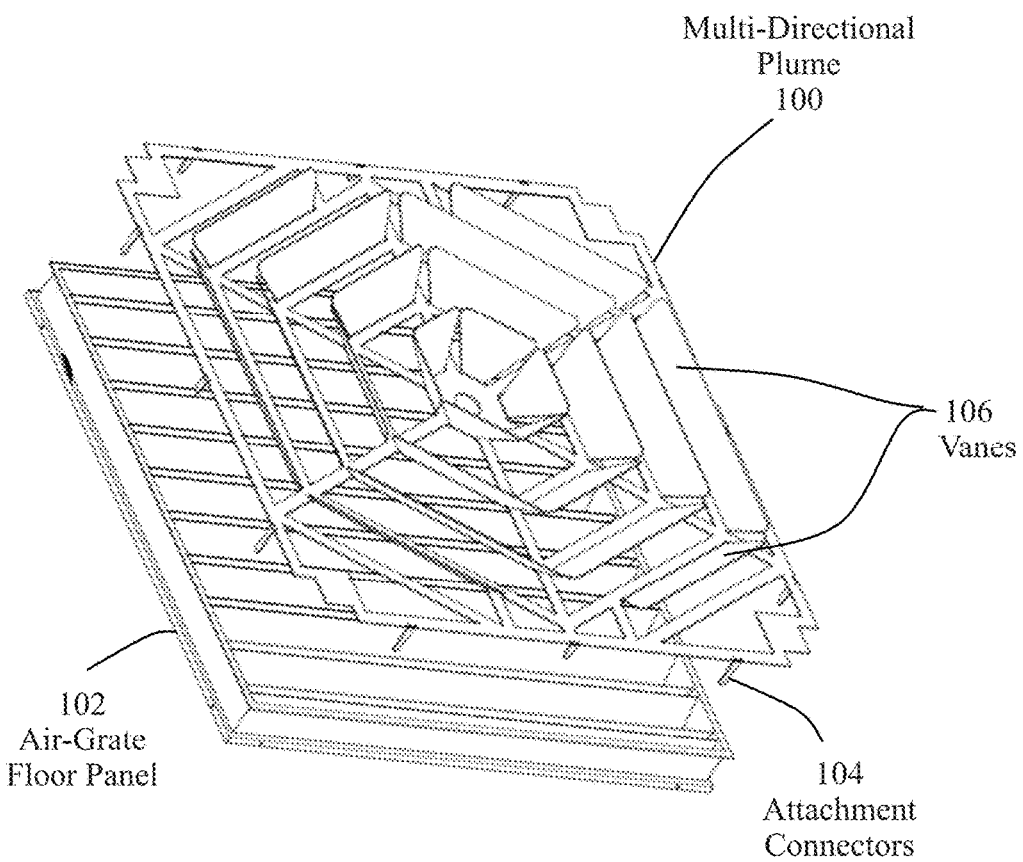
FIG. 1 is an isometric view of an embodiment of a multi-directional plume aligned for attachment with an air-grate floor panel.

FIG. 1 is an isometric view of a multi-directional plume 100 that can be detachably deployed on an air-grate floor panel 102. The multi-directional plume 100 has a series of vanes 106 that are deployed in six different directions to redirect air in the sub-plenum of a raised floor toward the air-grate floor panel 102. The air-grate floor panel 102 has a series of openings that cause the air from an air conditioning unit to be directed upwardly onto servers and other computer equipment that may be disposed in various types of computer rooms, including, but not limited to, large data centers. The multi-directional plume 100 has a plurality of attachment connectors, such as attachment connector 104. The attachment connector 104 may comprise any type of connector that is capable of connecting the multi-directional plume 100 to the air-grate floor panel 102 and the various girder plates and reinforcing rib plates on the open box air-grate floor panel 102. This is described in more detail in U.S. Pat. No. 9,217,252, entitled "Air-Grate Floor Panel Sub-Plenum Retrofit Airfoil," issued Dec. 22, 2015, to Gary Meyer, which is specifically incorporated herein by reference for all that it discloses and teaches. A retainer clip 19 is disclosed in the above-identified patent, which can be used as an attachment connector 104. Additionally, the attachment connector 104 may comprise a member that can be screwed, glued, or otherwise attached to portions of the bottom surface of the air-grate floor panel 102. The attachment connector 104 can include any type of attachment device, including rivets, hooks, loop fasteners, clips, grooves, magnetic connectors, or any desired type of connector.

In practice, embodiments of the present invention improve the capture of sub-plenum cooling air, supplied via in-row CRAC units, and redirects the captured cooling air upwardly through the top plate of the raised floor air-grate to enhance cooling efficiency to the computer servers in the upper plenum of the computer room.

Figure 2:
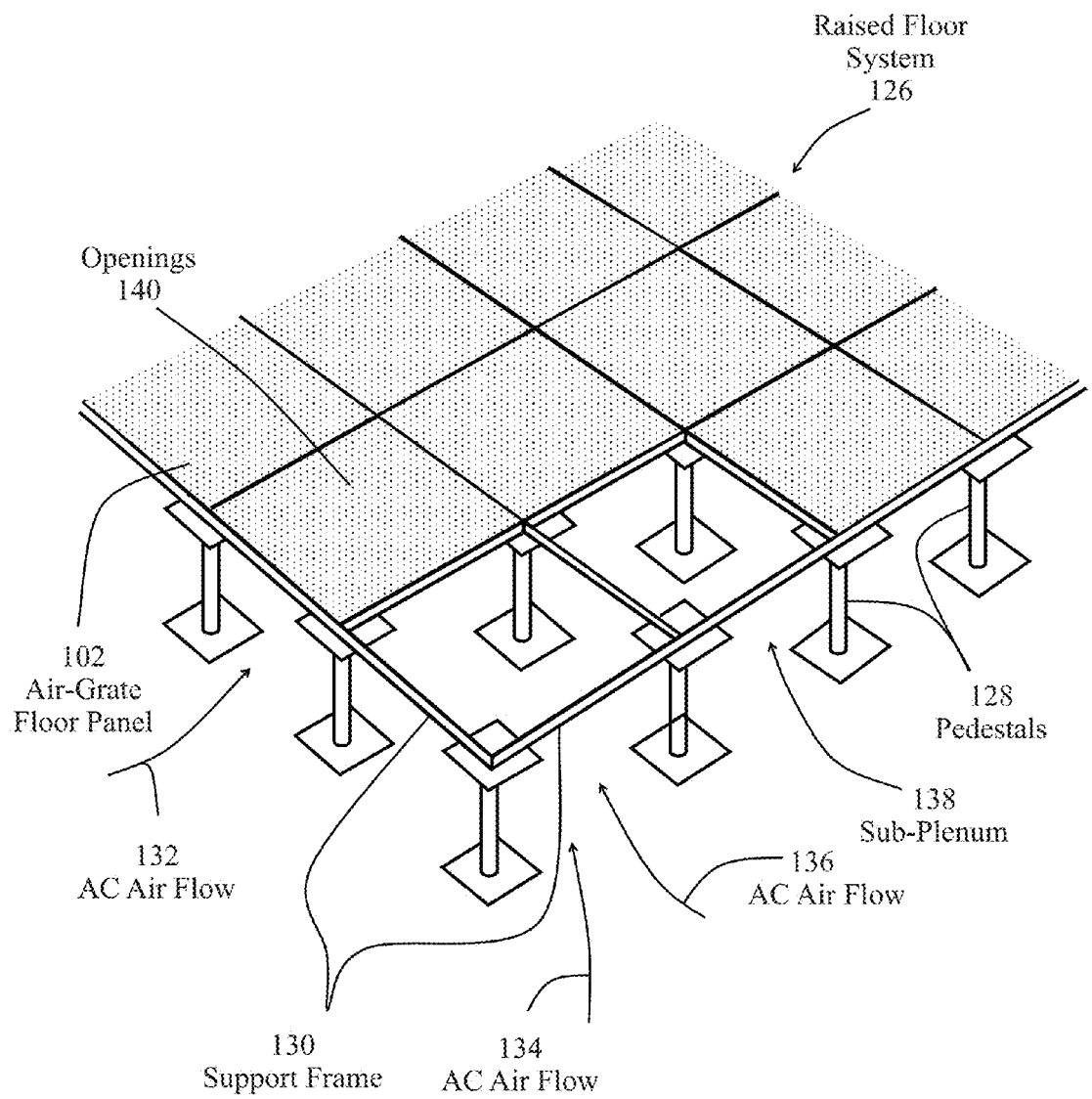
FIG. 2 is a typical pedestal raised floor system illustrating the manner in which air-grate floor panels are placed into the raised floor system structure.

FIG. 2 is a schematic representation of an embodiment of a raised floor system 126. As illustrated in FIG. 2, the raised floor system is supported by pedestals, such as pedestals 128, and support frame 130. The air-grate floor panels 102 are placed in the openings of the support frames 130 and are supported by the support frame 130 and pedestals 128 in a raised position over a subfloor. The area between the subfloor and the air-grate floor panels 102 is referred to as the sub-plenum 138. In computer rooms, air conditioning is supplied to the sub-plenum 138, so that cold air flows through openings 140 in the air-grate floor panel 102 to cool the computer equipment, including servers from the air-grate floor panels 102. Since cool air rises, the cool air from the air conditioning flows past the computer equipment and provides an efficient manner of cooling the computer equipment. To increase the efficiency of the air flowing upwardly through the openings 140 in the air-grate floor panels 102, it is beneficial to provide a plume, such as multi-directional plume 100, that is attached to the bottom of the air-grate floor panel 102. The multi-directional plume 100 has vanes 106, which redirect the air in an upward direction from the sub-plenum 138. The air conditioning ducts are normally disposed on the outside walls and direct the air in various directions in the sub-plenum 138. For example, the air conditioning air flow can be directed as shown by arrows 132, 134, 136, as well as other directions. The air flow direction may be in a single direction, or multiple directions, depending upon the installation of the air conditioning ducts. It is therefore beneficial to have a multi-directional plume 100 that can redirect air from various different directions to flow upwardly through the air-grate floor panels 102.

Figure 3:
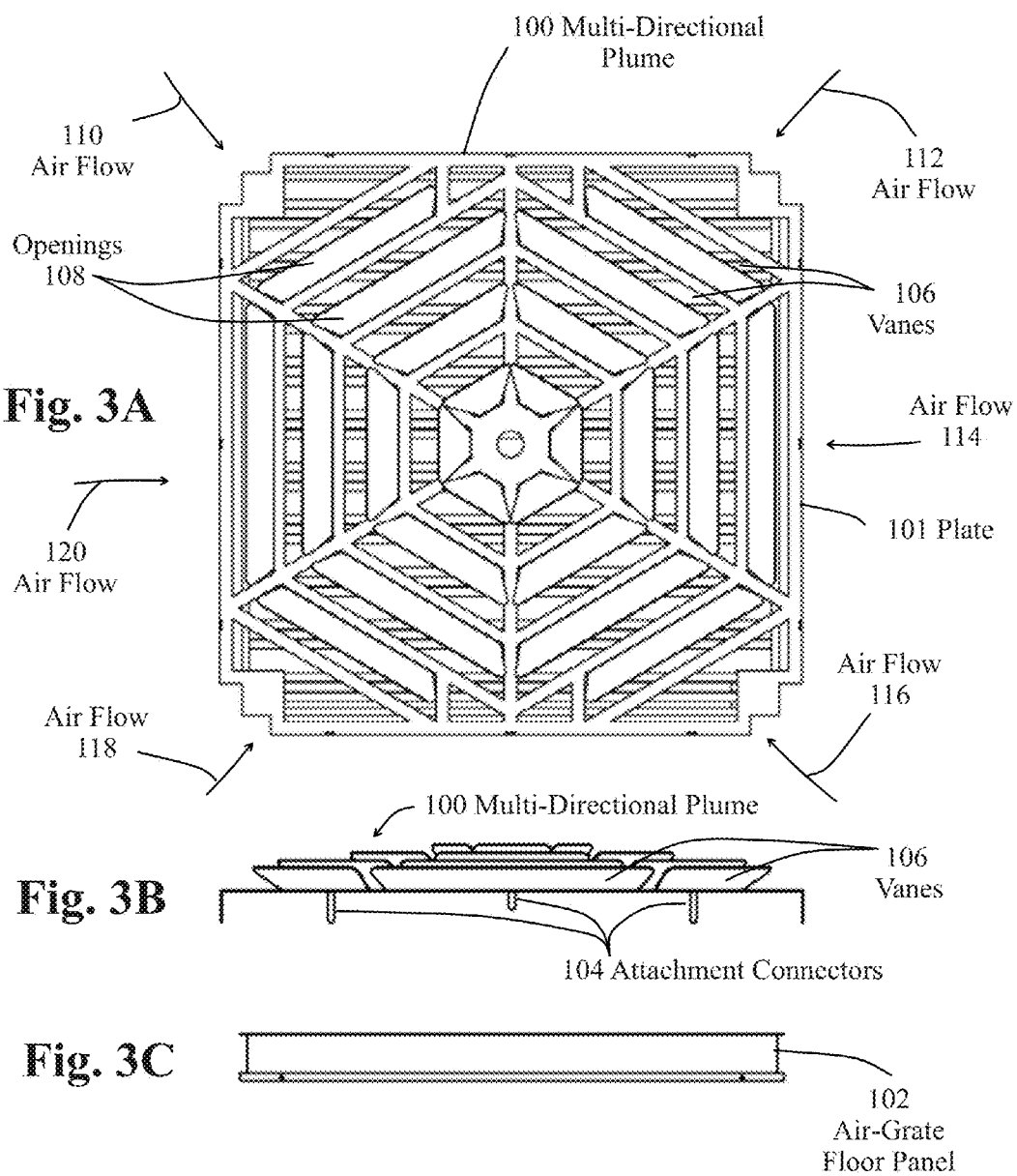
FIG. 3A is a top view of the multi-directional plume 100.
FIG. 3B is a side view of the multi-directional plume.
FIG. 3C is a side view of the air-grate floor panel that is aligned with the multi-directional plume.

FIG. 3A is a top view of an embodiment of the multi-directional plume 100. As illustrated in FIG. 3A, the multi-directional plume 100 has a plurality of vanes that are formed in the plate 101. The plate 101 can comprise various different materials, such as metal, plastic, polymer, composite materials, or any desired material that can function as a plume. The multi-directional plume can be injection molded or blow molded. The plume 101 may be made from a sheet of metal, which can be laser cut, so that the vanes 106 can be deflected and bent in a direction to deflect the air in the sub-plenum. A deflection of the vanes 106 leaves the openings 108 for air to flow through to the air-grate floor panel 102. The particular design and arrangement of the vanes 106 is arranged to maximize the capture of air flow in the direction shown by arrows 110, 112, 114, 116, 118, 120. Of course, air flow in slightly different directions is also captured by the vanes 106 of the multi-directional plume 100. In this manner, the multi-directional plume 100 can be placed on the air-grate floor panel 102 and capture air flow from the air conditioning in the sub-plenum in multiple directions. As such, the particular orientation of the air-grate floor panel in the raised floor system is not of concern and the air-grate floor panels 102 can be disposed in any of the four different directions in the raised floor system 126, as illustrated in FIG. 2.

FIG. 3B is a side view of the multi-directional plume 100 illustrating the attachment connectors 104 and vanes 106. The side view from each of the directions of FIG. 3A is identical because of the symmetrical nature of the multi-directional plume 100.

FIG. 3C is a side view of the air-grate floor panel 102. As illustrated in FIG. 3C, the air-grate floor panel is aligned with the multi-directional plume 100, illustrated in FIG. 3B, so that the attachment connectors 104 can attach to the various structural members of the air-grate floor panel 102.

Figure 4:
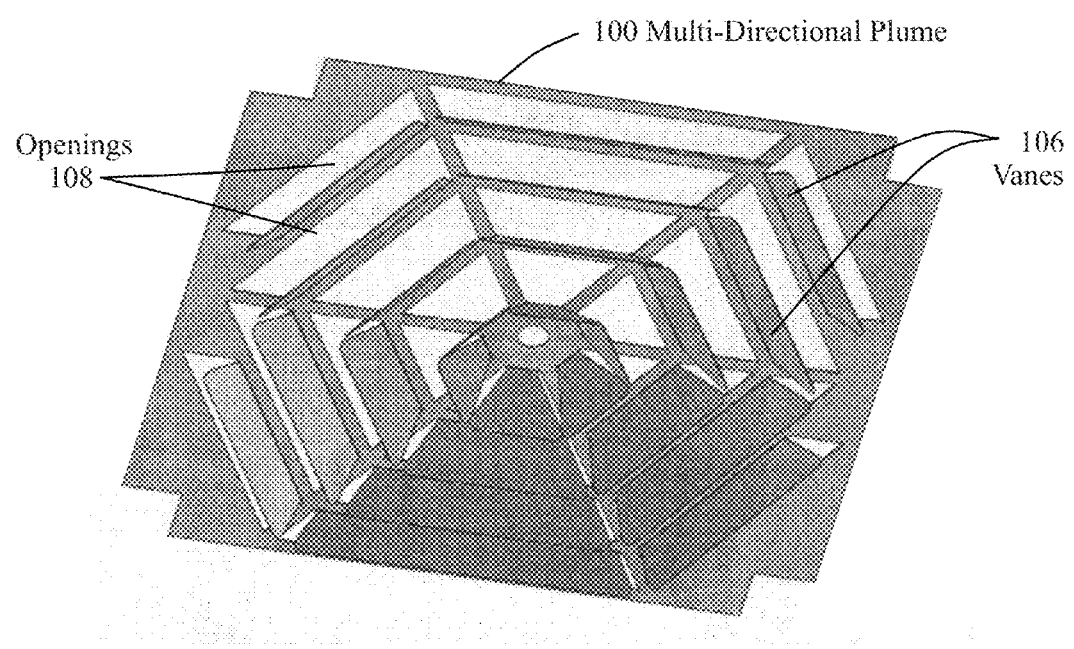
FIG. 4 is a bottom isometric view of the multi-directional plume.

FIG. 4 is a schematic bottom view of the multi-directional plume 100. As shown in FIG. 4, the vanes 106 protrude in a downward direction and leave openings 108 for air that is deflected by the vanes 106 to travel in an upward direction toward the air-grate floor panels and flow through the openings in the air-grate floor panels. Of course, any particular design of the orientation of the vanes 106 can be used, although the six different directions, illustrated in FIG. 3A and FIG. 4, provide a large coverage of directions of air flow. In that regard, various numbers of directions, such as two directions, four directions, eight directions, ten directions, or more, or even odd numbers of directions can be used.

Figure 5:
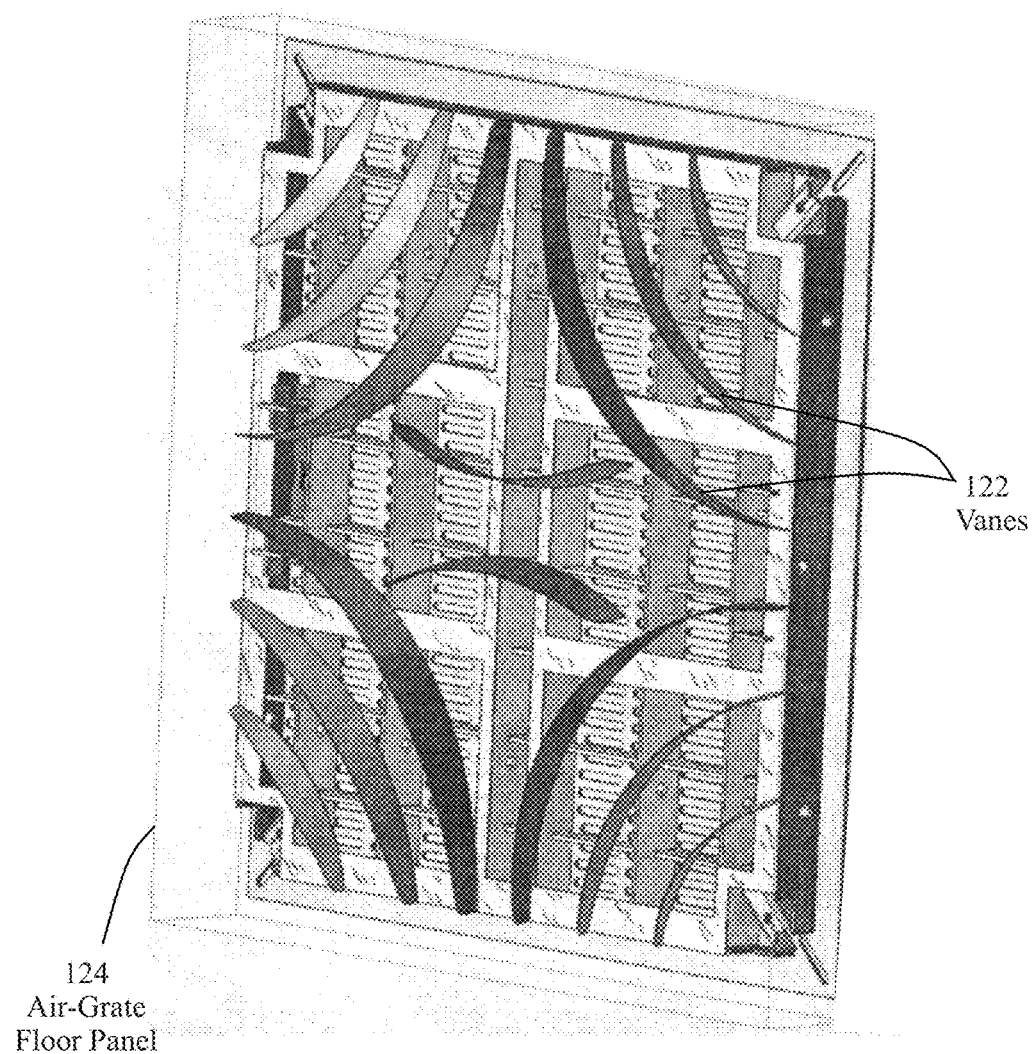
FIG. 5 is an isometric view of another embodiment of a multi-directional vane formation.

FIG. 5 is a schematic isometric view of another embodiment of an air vane system that captures air flowing from multiple different directions. As illustrated in FIG. 5, vanes 122 are individual vanes that are attached directly to the structural members of the air-grate floor panel 124. Again, the attachment can be made in any desired manner, as disclosed above. The individual vanes 122 may have an aerodynamic shape, as shown in FIG. 5, to deflect air from various flow directions. The curved shape of the vanes 122 allows air to be captured efficiently from substantially all directions, which is enhanced by the aerodynamic shape of the vanes 122.

Accordingly, the various embodiments of the present invention provide retrofits for air-grate floor panels that deflect air from a sub-plenum area in multiple directions without the need to either reposition the floor panels, or redirect the flow of air in the sub-plenum.

The foregoing description is considered as illustrative of the principles of the invention. Furthermore, since numerous modifications and changes will readily occur to those skilled in the art, it is not desired to limit the invention to the exact construction and process shown and described above. Accordingly, resort may be made to all suitable modifications and equivalents that fall within the scope of the invention. The words "comprise," "comprises," "comprising," "include," "including," and "includes" when used in this specification are intended to specify the presence of stated features, integers, components, or steps, but they do not preclude the presence or addition of one or more other features, integers, components, steps, or groups thereof.

What is claimed is:

1. In a raised floor system, a method for redirection of an omnidirectional sub-plenum airflow from a sub-plenum to computer equipment disposed on said raised floor system, comprising the steps of:
    providing an air-grate raised floor panel having an upper surface, a lower surface and a plurality of open air-flow ducts extending therethrough;
    providing an air-flow plume attachment by cutting a sheet of metal in a pattern to form a plurality of flaps disposed in a plurality of directions;
    bending said flaps to form downwardly projecting open end fins having an open end that creates an acute angle with said lower surface of said air-grate raised floor panel when said air-flow plume attachment is attached to said air-grate raised floor panel, said open end fins positioned to capture and deflect said omnidirectional sub-plenum airflow from a plurality of directions;
    attaching said air-flow plume attachment to said lower surface of said air-grate raised floor panel using attachment connectors;
    installing said air-grate floor panel on a raised floor pedestal support system so that said open end fins of said air-flow plume attachment extend from said lower surface of said air-grate raised floor panel into said sub-plenum which causes said oven end fins to capture and redirect said omnidirectional sub-plenum airflow from said plurality of directions towards said lower surface of said air-grate raised floor panel;
    supplying said sub-plenum of said raised floor pedestal support system with said omnidirectional sub-plenum air-flow; and
    directing said omnidirectional sub-plenum air-flow that has been redirected by said open end fins of said air-flow plume attachment towards said lower surface of said air-grate raised floor panel and through said plurality of open air-flow ducts in said air-grate raised floor panel without repositioning said installed air-grate floor panel.

2. The method of claim 1 wherein said process of attaching said air-flow plume attachment comprises attaching a multi-directional structure to a structural member of said air-grate floor panel using a clip.

3. The method of claim 1 wherein said process of attaching said air-flow plume attachment comprises attaching a multi-directional structure to a structural member of said air-grate floor panel using a screw.

4. The method of claim 1 wherein said process of attaching said air-flow plume attachment comprises attaching a multi-directional structure to a structural member of said air-grate floor panel using a magnet.

5. The method of claim 1 wherein said process of attaching said air-flow plume attachment comprises attaching a multi-directional structure to a structural member of said air-grate floor panel using a bonding adhesive.

6. The method of claim 1 wherein said step of providing said air-flow plume attachment comprises providing a multi-directional structure that has a plurality of open end fins that are directed in at least six different directions.

7. A system for redirecting sub-plenum air of a sub-plenum in a raised floor system comprising:
    an air-grate floor panel having an open box load bearing frame and a top plate having openings that allow air to pass through said air-grate floor panel;
    a multi-directional structure having a plurality of open end fins that are directed in a plurality of different directions and that form an acute angle with a lower surface of said air-grate floor panel so that said plurality of open end fins extend outwardly and downwardly in said plurality of different directions;
    connectors disposed on said multi-directional structure that connect said multi-directional structure to said air-grate floor panel such that said plurality of vanes extend outwardly into said sub-plenum when said air-grate floor panel and said multi-directional structure are disposed in said raised floor system and redirect air flowing in said sub-plenum through said openings in said top plate of said air-grate floor panel.

8. The system of claim 7 wherein said multi-directional structure is formed from a sheet of metal that is cut to form said vanes.

9. The system of claim 7 wherein said multi-directional structure is formed from molded plastic.

* * * * *